(12) United States Patent
Jau et al.

(10) Patent No.: US 10,531,592 B1
(45) Date of Patent: Jan. 7, 2020

(54) SMART RACK ARCHITECTURE FOR DISKLESS COMPUTER SYSTEM

(71) Applicant: QUANTA COMPUTER INC., Taoyuan (TW)

(72) Inventors: Maw-Zan Jau, Taoyuan (TW); Ching-Chih Shih, Taoyuan (TW); Chin-Lung Chang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 16/351,074

(22) Filed: Mar. 12, 2019

Related U.S. Application Data

(60) Provisional application No. 62/700,520, filed on Jul. 19, 2018.

(51) Int. Cl.
*H05K 5/00* (2006.01)
*H05K 7/18* (2006.01)
*H05K 5/02* (2006.01)
*H01H 9/02* (2006.01)

(52) U.S. Cl.
CPC ............... *H05K 7/186* (2013.01); *H01H 9/02* (2013.01); *H05K 5/0291* (2013.01)

(58) Field of Classification Search
CPC .................................. H05K 5/00; H05K 7/00
See application file for complete search history.

(56) References Cited

U.S. PATENT DOCUMENTS

| | | | |
|---|---|---|---|
| 7,349,204 B2* | 3/2008 | Tanaka | G06F 1/181 361/679.33 |
| 2017/0177222 A1* | 6/2017 | Singh | G06F 3/061 |

* cited by examiner

*Primary Examiner* — Jerry Wu
(74) *Attorney, Agent, or Firm* — Nixon Peabody LLP; Zhou Lu

(57) ABSTRACT

A system and method for efficient allocation of remote storage devices to computing devices in a rack is disclosed. An end of the rack switch is provided with physical storage devices and a storage service. The switch includes ports that are coupled to network interface cards of computing servers. The storage service allows each of the computing servers to access the physical storage devices. The network interface card includes a controller that can be configured into virtual storage controllers to allow access to different storage volumes.

11 Claims, 5 Drawing Sheets

SMART RACK ARCHITECTURE FOR DISKLESS COMPUTER SYSTEM

PRIORITY CLAIM

This application claims priority to U.S. Provisional Application No. 62/700,520 filed on Jul. 19, 2018. That application is hereby incorporated by reference in its entirety.

TECHNICAL FIELD

The present disclosure relates generally to a flexible storage system, and more specifically, to a system that includes a storage service in a rack switch to manage storage devices accessible by computing nodes in the rack.

BACKGROUND

The emergence of the cloud for computing applications has increased the demand for off-site installations, known as data centers, that store data and run applications accessed by remotely connected computer device users. A typical data center has physical chassis structures with attendant power and communication connections. Each rack may hold multiple network devices such as servers for computing, storage, or controls, as well as appropriate network and management switches. Each server in a rack may require access to a remote storage device for storing data when the data handled by the server exceeds the capability of the internal storage device of the server. Although remote storage devices may be set up in a coordinated array in a rack, they are more often simply a set of storage disks that require separate access for each of the other computing nodes in the rack.

Traditional computer systems including those that are set up in data centers have had several local disks. The disadvantage of such a system of local disks is that it lacks the agility of moving the local disk from an original system (e.g., a group of servers) to a new system (e.g., a new group of servers). A storage area network (SAN) architecture is a structure that supports remote storage of data for computer systems. A SAN architecture is a dedicated network that interconnects and presents shared pools of storage devices to multiple servers. Such an architecture can solve the problem of reallocating local disks to new systems, since a disk image can be dynamic in connecting to a different system through the SAN.

Traditional SAN storage architecture requires an additional storage service device to be installed into a dedicated storage system to supervise a network for all of the physical storage devices in the storage system. For example, a series of storage based servers that primarily include hard disk drives may be grouped to create a dedicated storage system. Such a storage system currently requires a storage service device to allow external computing servers to access the storage devices via a network managed by the storage service device. It is costly to provide the storage service device as well as integrate the storage system with other computing systems.

Thus, there is a need for a smart storage rack structure to integrate all local disks in one structure for access by computing nodes in the rack structure and thereby eliminate the requirement of a separate storage service device. There is a further need for a mechanism to emulate all local drives in a rack based remote storage system. There is a need for a system that allows all local disks of a computer system to be integrated in the same rack. There is also a need for remote security for ports connecting computing nodes to the storage devices of a storage system.

SUMMARY

One disclosed example is a storage system including a switch having a plurality of ports, a plurality of physical storage devices, and a storage service operable to manage the plurality of physical storage devices. The system includes a plurality of computing devices. Each of the computing devices has a processor, a network port, and a network interface card operable to be coupled to one of the ports of the switch. The switch allows network communication for the computing devices. The storage service allows the processor of each of the computing devices to access at least one of the physical storage devices as local storage.

Another disclosed example is a method of providing remote access to physical storage devices in a switch for computing devices. Each of the plurality of computing devices is connected to a port of an array of ports of a switch. Network communication is provided to the connected computing devices via the switch. At least one of the physical storage devices is allocated to the computing device via a storage service on the switch. The at least one of the physical storage devices is reallocated to another computing device via the storage service.

Another disclosed example is a rack based computing system. The system includes a rack assembly having a plurality of slots. A top of rack switch is located in one of the plurality of slots. The top of rack switch includes a plurality of ports, a plurality of physical storage devices, and a storage service. The system includes a plurality of computing servers. Each of the computing servers is located in a corresponding one of the plurality of slots in the rack. Each of the plurality of computing servers includes a network interface card. The network interface card is coupled to one of the ports of the top of rack switch. The top of rack switch allows network communication to the plurality of computing servers. The storage service allocates storage in at least one of the physical storage devices to at least one of the computing servers.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of exemplary embodiments together with reference to the accompanying drawings, in which.

Figure 1:
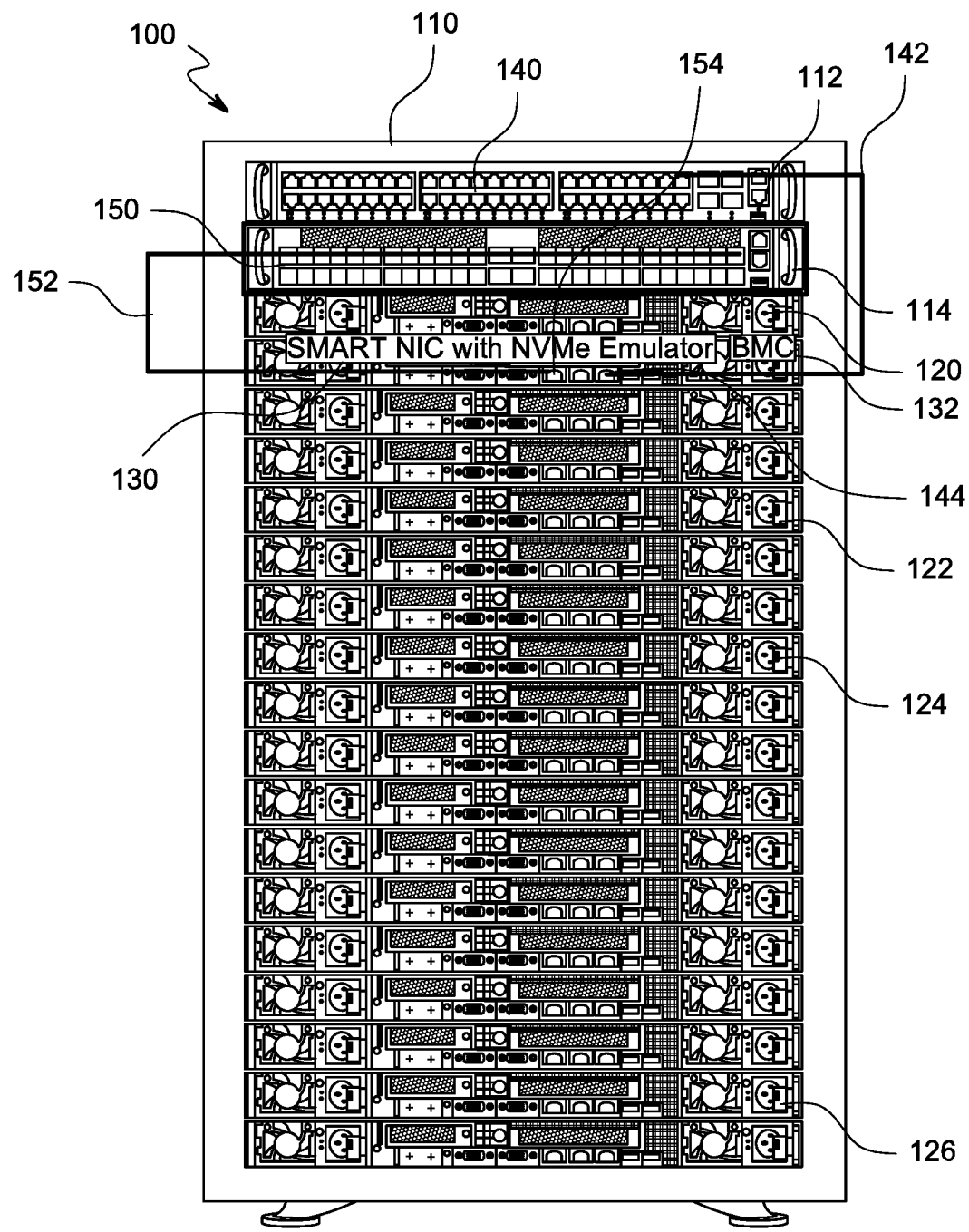
FIG. 1 is a diagram of an example rack assembly of computing nodes with a top of rack switch having storage service capabilities.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION OF THE ILLUSTRATED EMBODIMENTS

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

The example disclosed storage system includes four major features to allow more efficient access to remote storage by different computer systems in a rack. First, the system provides a combination top of the rack (TOR) or end of rack/end of row (EOR) switch that includes a storage service to allow access to computing nodes in a rack, thereby eliminating the need for a separate storage service device. The switch performs the role of a traditional switch of connecting rack devices together in a network, as well as the storage server in a single box. Second, a smart network interface card is provided for the rack computing nodes. The network interface card supports virtual storage switches such as PCIe switches and virtual non-volatile memory controllers to allow for alteration of remote storage devices accessible by the computing server. Third, remote storage settings are provisioned by a rack management service in the combination switch and the baseboard management controller (BMC) of a computing node. Fourth, the storage system provides port based security for a remote storage network link of a computing node to the storage system.

FIG. 1 shows a rack based system architecture 100 that incorporates the described features. The architecture 100 includes a rack unit 110. The rack unit 110 has a frame that includes a number of slots that may each hold electronic devices. In this example, the rack unit 110 is used to provide storage devices that may be accessed by different computing systems, such as computing servers in the rack unit 110. Each of the computing servers may be connected via a network to the storage devices in the rack unit 110.

The rack based system architecture 100 includes a management switch 112 and a top of rack switch 114 installed in the top two slots of the rack unit 110. The top of rack switch 114 includes a number of physical storage devices, such as hard disk drives (HDD) or solid state drives (SDD), that may be accessed by external computing systems or devices. As will be detailed below, the top of the rack switch performs traditional networking functions to connect rack devices in a network as well as providing a storage service to allow rack devices to access remote storage devices in the rack. In this example, the rest of the slots below the top of rack switch 114 mount computing nodes such as computing servers 120, 122, 124 and 126.

Each of the computing servers such as the computing server 120, includes a processing unit or units and accompanying support components such as a baseboard, power supply, controller circuits, and fans. In this example, each of the computing servers such as the computing server 120 includes a smart network interface card (NIC) 130 and a baseboard management controller (BMC) 132. The network interface card 130 allows access to external storage devices in the top of rack switch 114, as will be explained below. The baseboard management controller 132 manages power and status of the components on the storage server and communicates port information to the management switch 112.

The management switch 112 includes an array of ports 140. Each of the ports in the array of ports 140 may be connected to a management port of one of the computing servers in the rack unit 110, such as the computing server 120. The management port is connected with the respective baseboard management controller of the computing server to allow communication of operational data to the management switch 112. For example, one of the ports of the port array 140 is connected via a cable 142 to a management port 144 on the computing server 120, to allow communication between the baseboard management controller 132 and the management switch 112.

The top of rack switch 114 also includes an array of ports 150. Each of the ports in the array of ports 150 may be connected to a network data port of one of the computing servers in the rack unit 110. The network data port of the computing server is in communication with the smart network interface card of the respective computing server. For example, one of the ports of the port array 150 is connected via a cable 152 to a network data port 154 on the computing server 120. In this manner, the top of rack switch 114 serves as an aggregation switch for the computing servers in the rack 110, and allows network communication with devices external to the rack 110.

As detailed below, the top of rack switch 114 includes a storage service in addition to the network components connected to the port array 150 that networks devices connected to the ports. The storage service manages the physical storage devices in the top of rack switch 114. The storage service also manages virtual volumes that may be created from the physical storage devices. The storage service allows the storage of the physical storage devices to be remotely allocated to any of the connected computing servers in the rack unit 110. Further, storage service allows the creation of virtual storage volumes via a request from any of the connected computing servers to allow for more remote storage. Finally, the storage service allows reallocation of storage from the physical storage devices on the top of rack switch 114 to different computing servers.

Figure 2:
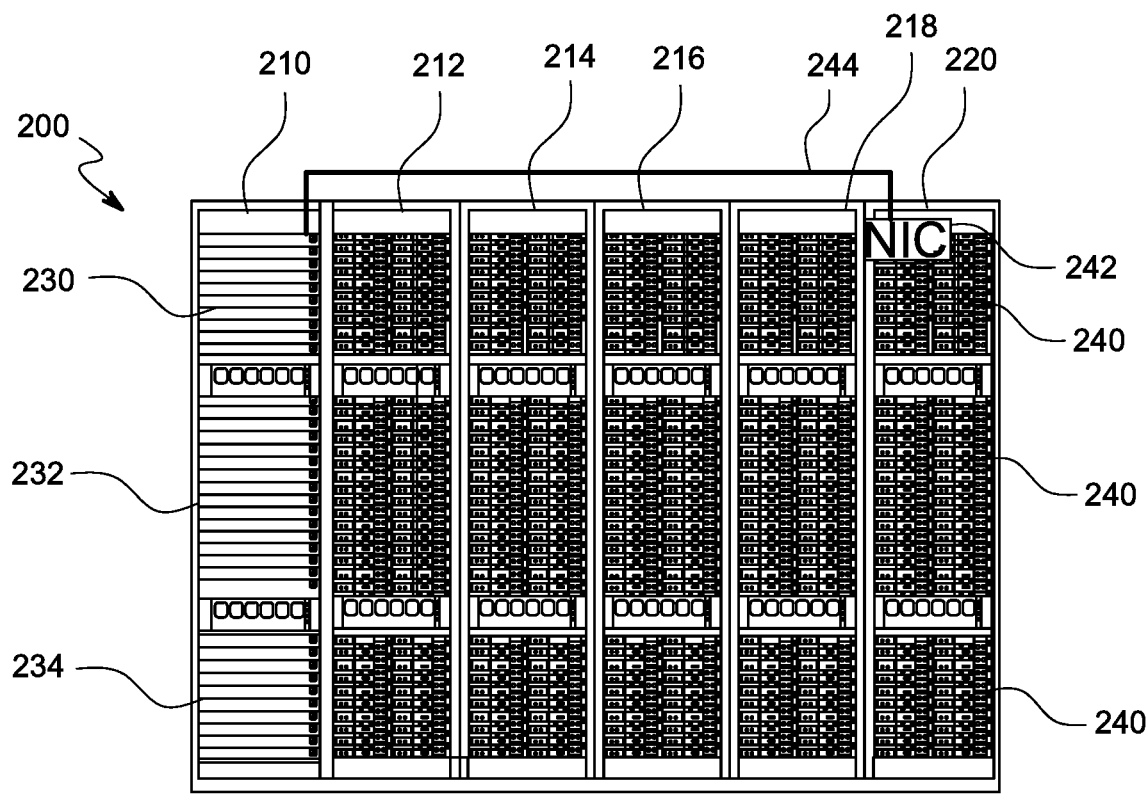
FIG. 2 is another rack assembly with a series of end of row switches with storage servers to support computing nodes in racks.

FIG. 2 shows an end of row based computing architecture system 200. The system 200 includes a series of racks 210, 212, 214, 216, 218, and 220. Each of the racks 210, 212, 214, 216, 218, and 220 include multiple slots to hold electronic components. The rack 210 holds end of the row switches, while the racks 212, 214, 216, 218, and 220 hold computing servers in this example. Thus, end of row switches 230, 232, and 234 are mounted in the rack 210. Each of the end of row switches 230, 232, and 234 include storage devices such as hard disk drives or solid state drives. Each of the end of row switches 230, 232, and 234 include an array of ports, each of which are connected to one of the computing servers in the other racks 212, 214, 216, 218, and 220. For example, the rack 220 includes multiple computing servers 240. Each computing server 240 includes a baseboard management controller and a smart network interface card 242. The network interface card 242 is connected to a network port on the computing server 240 that is connected via a cable 244 to one of the end of row switches such as the end of row switch 230. Thus, in this example, the computing servers 240 in the rack 220 are all connected to corresponding ports in the end of row switch 230. The computing servers for multiple racks may be connected to one of the end of row switches. For example, the servers in racks 216 and 218 may be connected to ports of the end of row switch 232.

Each of the end of row switches 230, 232, and 234 allow the respective connected devices to be networked. Each of the end of row switches 230, 232, and 234 also include a storage service that allows each of the computing servers that are connected to the respective end of row switch to access either physical storage or storage volumes of the end of row switches 230, 232, and 234. Thus, each of the end of row switches 230, 232, and 234 are similar to the top of rack switch 114 in FIG. 1, as they each perform both a network function as well as a storage server function. Similarly, each of the computing servers in FIG. 2 include a smart network interface card that allows the computing server to access physical storage or storage volumes in the corresponding end of row switch.

Figure 3:
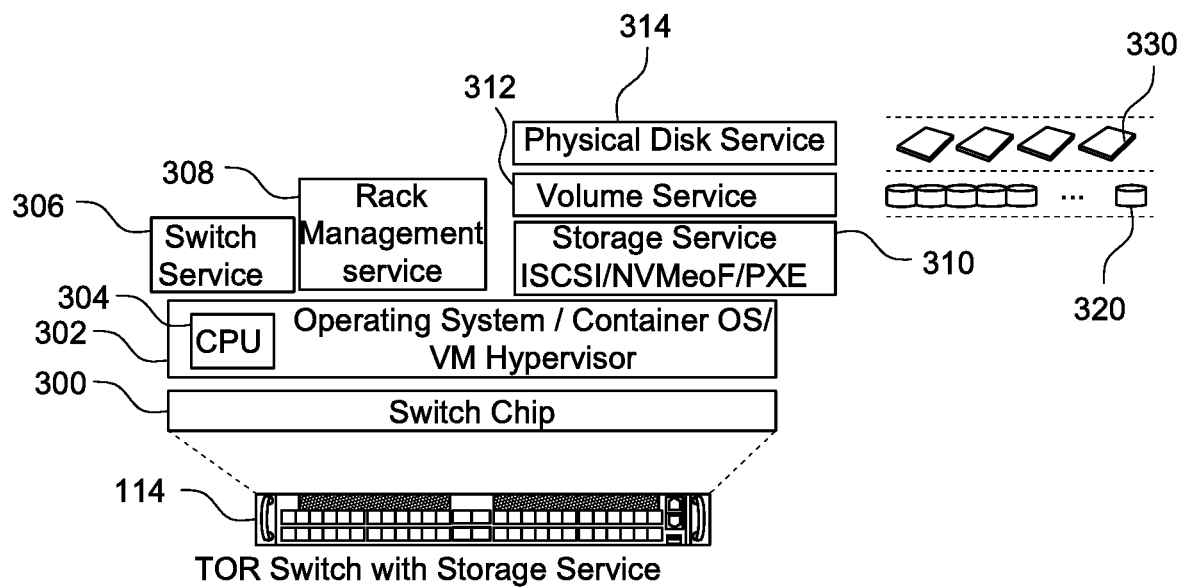
FIG. 3 is a block diagram of the top of rack switch in FIG. 1.

FIG. 3 is a block diagram of an example top of rack switch, such as the top of rack switch 114 in FIG. 1. The top of rack switch 114 includes storage supervision capabilities for the computing servers in the rack 110 in FIG. 1, that will be explained below. The top of rack switch 114 includes a switch chip 300, an operating system 302, a CPU 304, a switch service 306, a rack management service 308, a storage service 310, a volume service 312, and a physical disk service 314. The switch chip 300 handles network packet forwarding. The switch service 306 handles L2 and L3 packet forwarding and routing. The volume service 312 manages different logical storage volumes 320, which are divisions of physical storage units in the top of rack switch 114. The physical disk service 314 manages physical storage devices 330, such as hard disk drives or solid state drives on the top of rack switch 114. In this example, there are four hard disk drives in the top of rack switch 114, but there may be different numbers of physical storage devices managed by the top of rack switch 114.

The top of rack switch 114 performs switch functions for networking the servers in the rack 110. However, unlike a traditional Ethernet switch that is solely dedicated to a packet forwarding role for servers in the rack 110, the top of the row switch 114 also allows for management of storage devices for access by the computing servers in the rack 110. Specifically, the top of rack switch 114 allows the capability to add more storage devices or storage volumes to be accessed by the computing servers such as the computing server 120 in the rack 110 in FIG. 1. The volume service 312 allows for the building of the logical volumes 320 from the physical storage devices in the top of rack 114. Storage services such as Internet small computer system interface (iSCSI), NVME over fabric (NVMeoF), PXE or any kind of software defined storage service can export logical volumes to the computer systems, such as the computing server 120 via the top of rack switch 114. The rack management service 308 may work with the smart network interface cards and the baseboard management controller for each of the computing servers to identify the switch port connected to the computer system, and thus provide security for the port. As explained above, these features may also be implemented in the end of row switches such as those shown in FIG. 2.

Figure 4:
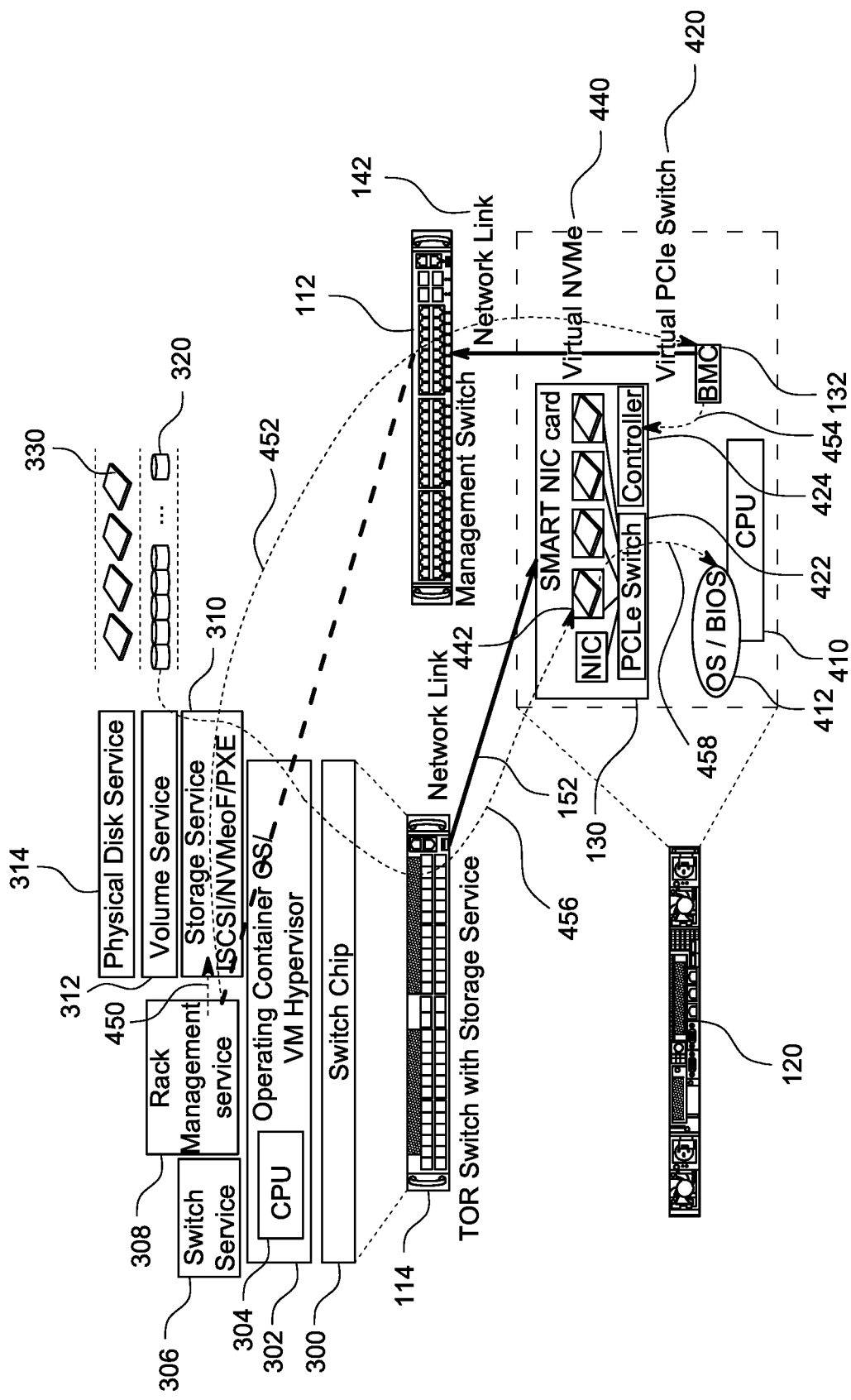
FIG. 4 is a block diagram of the top of rack switch and computing server in FIG. 1 and the process of provisioning a remote storage volume for the computing server.

As explained above with regard to FIG. 1, the example smart network interface card 130 supports a virtual storage switch such as a PCIe switch as well as virtual non-volatile memory controllers. FIG. 4 shows a block diagram of an example computing server such as the computing server 120 in FIG. 1 including the smart network interface card 130 and the baseboard management controller 132. The smart network interface card 130 is shown in relation to the top of rack switch 114. Like elements of the top of the row switch 114 in FIG. 3 are labeled with identical element numbers in FIG. 4. The baseboard management controller 132 is connected to the management switch 112 via a network link in the form of the cable 142. The network interface card 130 is connected to the top of rack switch 114 via a network link in the form of the cable 152. There is also a network connection between the rack management service 308 of the TOR data switch 114 and management switch 112 to send commands to the BMC 132 by the management network.

The computing server 120 includes a CPU 410 that executes an operating system 412. As shown in FIG. 4, the smart network interface card 132 supports a virtual PCIe switch 420 that is composed of a physical PCIe switch 422 and a controller 424. In this example, the controller 424 is a programmable hardware device, such as a FPGA, that may be configured into multiple virtual memory controllers. The controller 424 is connected to the baseboard management controller 132 and the PCIe switch 422 is connected to the CPU 410. The smart network interface card 132 also supports a virtual non-volatile memory 440 that is composed of the physical memory devices 442 such as hard disk drives or solid state drives in the top of rack switch 114. The virtual PCIe switch 420 may be any suitable virtual storage switch such as a serial attached SCSI (SAS) expander, host bus adapter (HBA), or SAS controller card.

Figure 5:
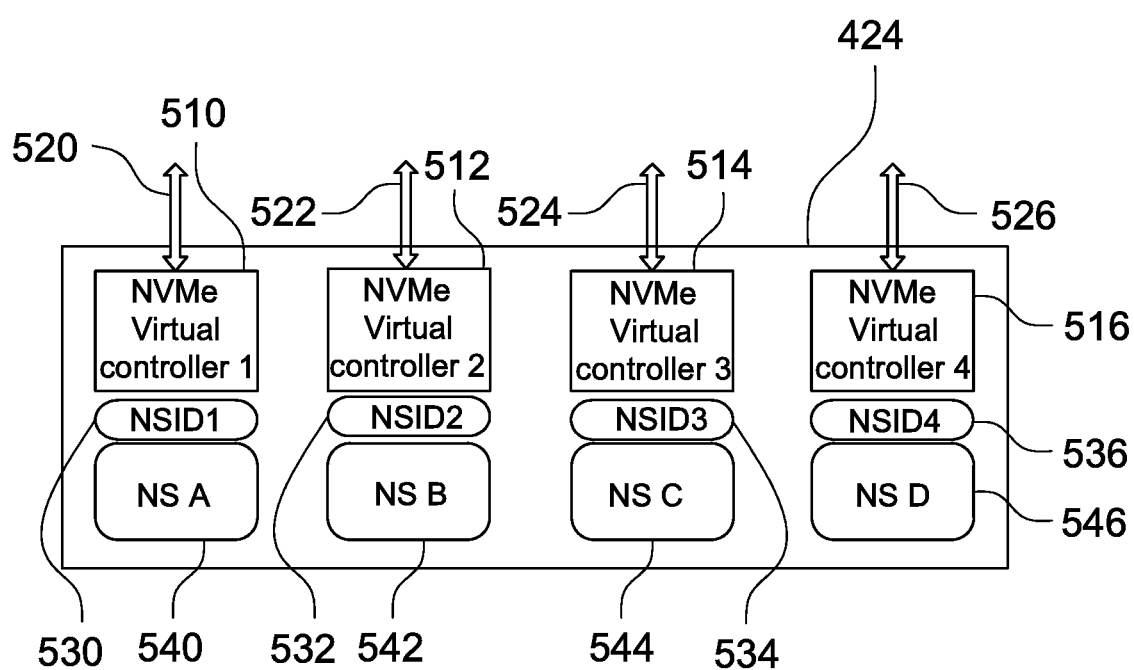
FIG. 5 is a block diagram of the controller of the smart network interface card in FIG. 4 configured for different virtual storage volumes.

FIG. 5 is a block diagram of the memory controller 424 shown in FIG. 4 that has been configured for multiple virtual memory controllers. In this example, the memory controller 424 has been configured to a first virtual NVMe controller PCI function block 510, a second virtual NVMe controller PCI function block 512, a third virtual NVMe controller PCI function block 514 and a fourth virtual NVMe controller PCI function block 516. Each of the virtual NVMe controllers 510, 512, 514 and 516 may be connected to a respective PCIe downstream port 520, 522, 524, and 526 of the PCIe switch 422. The virtual memory controller 520 includes a first name space 530 and corresponding name ID 540. Similarly, the virtual memory controllers 522, 524, and 526 include respective second, third and fourth name spaces 532, 534, and 536, as well as corresponding name IDs 542, 544, and 546. Each of the name spaces 530, 532, 534, and 536 correspond to logic storage volumes. The logical storage volumes are organized from the physical memory devices 330 in the top of rack switch 114 shown in FIG. 1.

The smart network interface card 130 in FIG. 4 can support multiple remote storage targets that may become local NVMe disks for the computing server 120. This is distinct from known systems, which require a single memory controller with multiple name spaces to support multiple volumes created from the physical memory devices. As shown in FIG. 5, the smart network interface controller 130 in this example has a single configurable hardware memory controller 424 that is configured into multiple virtual memory controllers with corresponding name spaces 530, 532, 534, and 536. As shown in FIG. 4, the virtual PCIe switch 422 is implemented with multiple NVMe controllers for multiple virtual NVMe emulation. Thus, a single controller has a single NVMe name space that needs a PCIe switch to support multiple MVMe devices for a host. Another implementation is single controller with multiple name spaces that doesn't need a PCIe Switch to support multiple devices. The advantage of this implementation is better emulation of dynamic NVMe hot plugging since a physical hard disk drive may be added or removed on a NVMe controller basis.

Another feature of the storage service implemented by the top of rack switch 114 in FIG. 4 is the provision of remote storage settings for storage devices in the external computing nodes such as the computing server 120. The smart NIC card 130 includes the controller 424 with an interface, such as an I2C bus, an internal network interface card, or a UART, to the baseboard management controller 132. The interface allows communication to the BMC 132 and allows a remote storage settings provision procedure to be performed. The remote storage setting provision may be thus implemented by the BMC 132 to the smart NIC 130, if a user requests a new disk to be accessible to the host computing server.

The remote target setting provisioning process may be seen via the dashed lines in FIG. 4. First, the rack management service 308 requests a new volume from the volume service 312 and the storage service 310 (450). The rack management service 308 then sends remote target information such as the Target Name, Target IP address, Authentication Information and any other required remote storage access settings to the BMC 130 of one of the computing servers 120 in the rack 110 via the management switch 112 (452). The BMC 130 of the computing node passes the remote target information to the NIC controller 424 of the network interface card 130 (454). The smart NIC controller 424 creates a new virtual NVMe disk to a downstream port of the virtual PCIe switch 420 (456). The controller 424 then converts a remote storage access protocol to a local NVMe protocol to emulate a NVMe disk. The OS or BIOS 412 executed by the CPU 410 can then detect a new NVMe that is connected to the computing server 120 (458).

The remote storage access protocol can be any kind of network block/file/object based protocol. For example, the remote access protocol may be block device based iSCSI, or NVMeoF, or file based common Internet file system (CIFS), network file system (NFS), or object based storage software such as CEPH.

Figure 6:
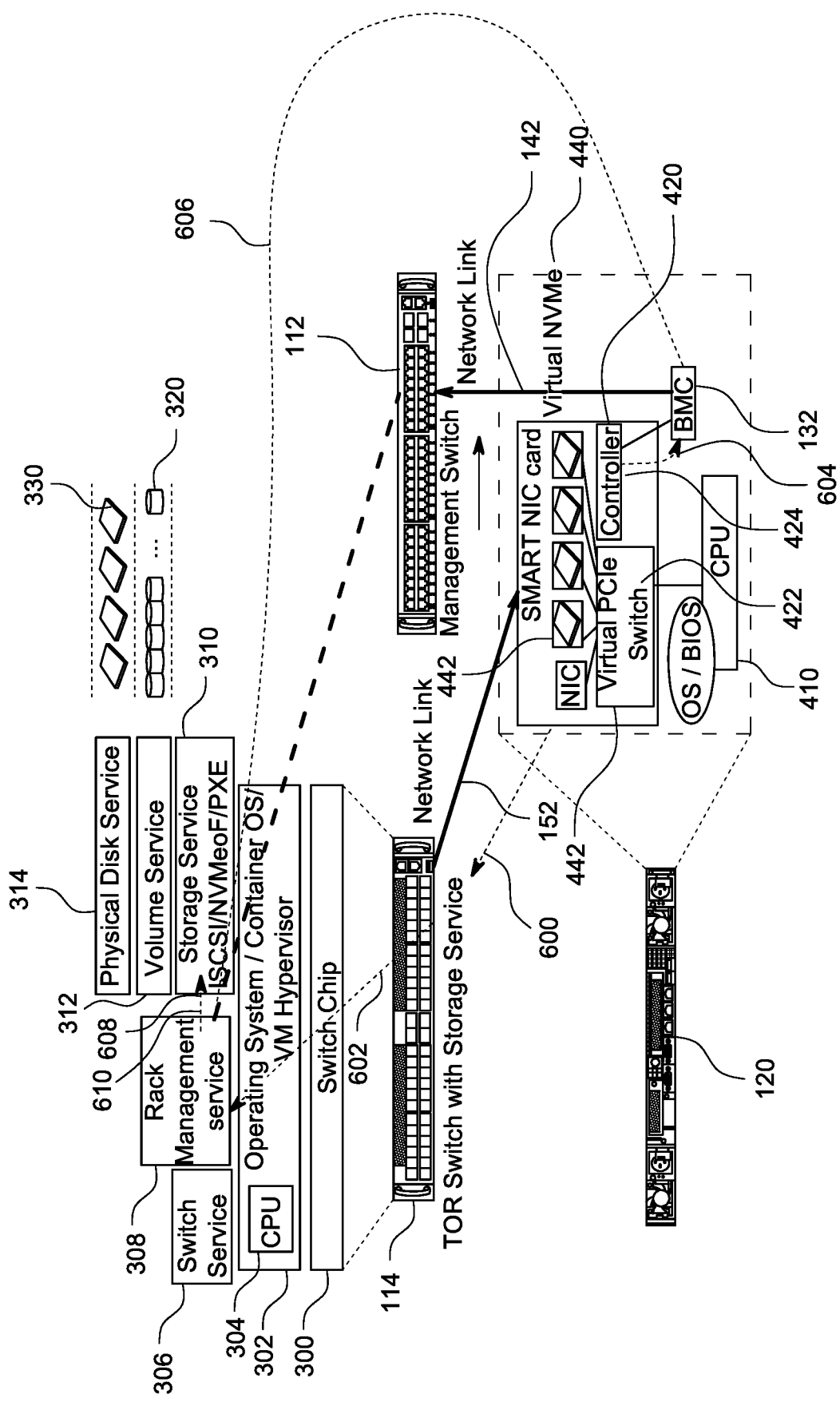
FIG. 6 is a block diagram of the components in FIG. 4 and a remote security protocol.

FIG. 6 shows the process for providing port based security in the system 100 shown in FIGS. 1 and 4. Like components in FIG. 6 are labeled with their like elements numbers in FIG. 4. The rack management service 308 of the top of rack switch 114 can work with the switch service 306 and the BMC of a computing server, such as the computing server 120, to identify the switch port of the top of rack switch 114 connected to the NIC of the computing server 120. As will be explained, a port based security control can be implemented by the storage service 310. This allows only a storage access request from the switch port that is connected to the target computer system to access its storage target. Other access requests are denied thereby insuring the security of storage requests to the proper computing system.

The bold dashed lines in FIG. 6 shows the interaction between various components for the process of port based security control in the system shown in FIG. 4. The network interface card 130 sends a link layer discovery protocol (LLDP) message with the media address control (MAC) address of the network interface card 130, to the connected switch port of the top of the rack switch 114 via the cable 152 (600). The switch service 306 reports the MAC address of the neighbor port of the switch port to the rack management service 308 (602). The BMC 132 then obtains the MAC address of the smart network interface card 130 from the controller 424 of the smart network interface card 130 (604). The BMC 132 reports the MAC address of the smart network interface card 130 to the rack management service 308 via the management switch 112 (606). Based on the MAC address information of the network interface card 130 obtained from the top of the rack switch 114 and the BMC 132, the rack management service 308 can identify the switch port number that is connected to the network interface card 130 of the computing server 120. The rack management service 308 applies port based security control for only allowing the target computing server 120 to access the remote target that is associated with the computing system 120.

Thus, the system 100 introduces a new smart rack architecture that includes a top of rack switch that integrates the functions of a traditional switch and a SAN storage system into the same box. This allows all local storage devices for computer systems to be located in the top of rack switch.

Further, to better emulate all local drives from the rack based remote storage in the top of rack switch, the system also includes a new network interface card architecture. The NIC architecture can seamlessly replace local drives in the rack based remote storage, may be simply deployed, and has better security control.

As used in this application, the terms "component," "module," "system," or the like, generally refer to a computer-related entity, either hardware (e.g., a circuit), a combination of hardware and software, software, or an entity related to an operational machine with one or more specific functionalities. For example, a component may be, but is not limited to being, a process running on a processor (e.g., digital signal processor), a processor, an object, an executable, a thread of execution, a program, and/or a computer. By way of illustration, both an application running on a controller, as well as the controller, can be a component. One or more components may reside within a process and/or thread of execution, and a component may be localized on one computer and/or distributed between two or more computers. Further, a "device" can come in the form of specially designed hardware; generalized hardware made specialized by the execution of software thereon that enables the hardware to perform specific function; software stored on a computer-readable medium; or a combination thereof.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Although the invention has been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application. Thus, the breadth and scope of the present invention should not be limited by any of the above described embodiments. Rather, the scope of the invention should be defined in accordance with the following claims and their equivalents.

What is claimed is:

1. A storage system comprising:
a rack assembly having a plurality of slots;
a top of rack switch having a plurality of ports, a plurality of physical storage devices, a rack management service, a volume service, and a storage service operable to manage the plurality of physical storage devices;
a management switch;
a plurality of computing devices, each of the plurality of computing devices located in a corresponding one of the plurality of slots, and each of the computing devices having a processor, a network port, a baseboard management controller, and a network interface card operable to be coupled to one of the ports of the top of rack switch, wherein the top of rack switch is operable to network the plurality of computing devices, wherein the network interface card includes a controller and a virtual storage switch, and wherein the virtual storage switch allows the controller to communicate with the storage service; and
wherein each of the plurality of computing devices is configured to request a new volume from the volume service and the storage service, and wherein the rack management service sends remote target information to the baseboard management controller via the management switch, and
wherein the storage service allocates storage in at least one of the physical storage devices to at least one of the computing devices.

2. The system of claim 1, wherein the controller is a configurable hardware device operable to be configured to a plurality of virtual storage controllers, each corresponding to a virtual volume created from the plurality of physical storage devices.

3. The system of claim 1, wherein the top of rack switch provides port security by reading a port identification from the baseboard management controller on one of the computing devices and only allowing the computing device to access the physical storage device via the switch port coupled to the computing device.

4. The system of claim 1, wherein the plurality of physical storage devices are one of a hard disk drive or a solid state drive.

5. The system of claim 1, wherein the storage service creates virtual storage volumes from the plurality of physical storage devices.

6. A method of providing remote access to one of a plurality of physical storage devices in a top of rack switch for computing devices, the top of rack switch including a plurality of ports, a rack management service, a volume service, and a storage service, the top of rack switch located in one of a plurality of slots in a rack assembly, each of the computing devices located in a corresponding one of the plurality of slots, each of the plurality of computing devices including a network interface card and a baseboard management controller, wherein the network interface card is coupled to one of the ports of the top of rack switch and wherein the network interface card includes a controller and a virtual storage switch, and wherein the virtual storage switch allows the controller to communicate with the storage service, the method comprising:
connecting each of the plurality of computing devices to a corresponding port of an array of ports of the top of rack switch;
providing a network connection for each of the connected plurality of computing devices via the switch;
receiving a request from one of the computing devices for a new volume from the volume service and the storage service;
sending remote target information to the baseboard management controller of the requesting computing device via a management switch;
allocating at least one of the physical storage devices to the computing device via the storage service on the top of rack switch; and
reallocating the at least one of the physical storage device to another computing device via the storage service.

7. The method of claim 6, wherein the controller is a configurable hardware device, and wherein the method further comprises configuring the controller to a plurality of virtual storage controllers, each corresponding to a virtual volume created from the plurality of physical storage devices.

8. The method of claim 6, further comprising:
reading a port identification from the baseboard management controller on one of the computing devices; and
only allowing the computing device to access the allocated physical storage device via the switch port coupled to the computing device.

9. The method of claim 6, wherein the physical storage devices are one of a hard disk drive or a solid state drive.

10. The method of claim 6, further comprising creating virtual storage volumes from the plurality of physical storage devices, wherein one of the virtual storage volumes is allocated to the computing device.

11. A rack based computing system comprising:
a rack assembly having a plurality of slots;
a top of rack switch located in one of the plurality of slots, the top of rack switch including a plurality of ports, a rack management service, a volume service, a plurality of physical storage devices, and a storage service;
a management switch;
a plurality of computing servers, each computing server located in a corresponding one of the plurality of slots, each of the plurality of computing servers including a network interface card and a baseboard management controller, wherein the network interface card is coupled to one of the ports of the top of rack switch, and wherein the network interface card includes a controller and a virtual storage switch, and wherein the virtual storage switch allows the controller to communicate with the storage service;

wherein the top of rack switch allows network communication to the plurality of computing servers;

wherein each of the plurality of computing servers is configured to request a new volume from the volume service and the storage service, and wherein the rack management service sends remote target information to the baseboard management controller via the management switch, and wherein the storage service allocates storage in at least one of the physical storage devices to at least one of the computing servers.

* * * * *